United States Patent
Chang et al.

(10) Patent No.: US 8,077,465 B2
(45) Date of Patent: Dec. 13, 2011

(54) HEAT SINK ASSEMBLY WITH FIXING MEMBER

(75) Inventors: Yao-Ting Chang, Taipei Hsien (TW); Meng-Hsien Lin, Taipei Hsien (TW); Yu-Chia Lai, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 173 days.

(21) Appl. No.: 12/546,631

(22) Filed: Aug. 24, 2009

(65) Prior Publication Data
US 2010/0259900 A1    Oct. 14, 2010

(30) Foreign Application Priority Data

Apr. 14, 2009  (CN) .......................... 2009 1 0301526

(51) Int. Cl.
H05K 7/20 (2006.01)
F28F 7/00 (2006.01)
H01L 23/34 (2006.01)
A44B 11/25 (2006.01)

(52) U.S. Cl. ........ 361/703; 361/697; 361/710; 361/719; 361/679.54; 165/80.3; 165/185; 257/719; 257/722; 24/453; 24/458; 24/459; 24/520

(58) Field of Classification Search .................. 361/697, 361/703, 704, 709–710, 718–719, 679.54; 165/80.2–80.3, 185; 257/718–719, 722; 24/453, 458, 459, 520
See application file for complete search history.

(56) References Cited

U.S. PATENT DOCUMENTS

| | | | | |
|---|---|---|---|---|
| 7,100,681 | B1 * | 9/2006 | Wu et al. ................. | 165/104.33 |
| 7,489,513 | B2 * | 2/2009 | Lai et al. ................ | 361/710 |
| 7,633,756 | B2 * | 12/2009 | Xu ........................ | 361/700 |
| 7,729,119 | B2 * | 6/2010 | Yang ...................... | 361/700 |
| 7,866,375 | B2 * | 1/2011 | Zhou et al. ............. | 165/104.33 |
| 2007/0242433 | A1 * | 10/2007 | Lin et al. ................ | 361/697 |
| 2007/0251670 | A1 * | 11/2007 | Peng et al. ............. | 165/80.4 |
| 2007/0279872 | A1 * | 12/2007 | Lai et al. ................ | 361/710 |
| 2008/0128111 | A1 * | 6/2008 | Zhou et al. ............. | 165/80.3 |
| 2008/0128118 | A1 * | 6/2008 | Chen et al. ............. | 165/104.33 |
| 2008/0216990 | A1 * | 9/2008 | Min et al. ............... | 165/80.3 |
| 2009/0135562 | A1 * | 5/2009 | Yang ..................... | 361/697 |
| 2009/0161316 | A1 * | 6/2009 | Xu ........................ | 361/700 |
| 2009/0165998 | A1 * | 7/2009 | Xu ........................ | 165/80.3 |
| 2009/0168350 | A1 * | 7/2009 | Xu ........................ | 361/697 |
| 2010/0101756 | A1 * | 4/2010 | Chu et al. .............. | 165/80.3 |

FOREIGN PATENT DOCUMENTS

| CN | 2881953 Y | 3/2007 |
|---|---|---|
| CN | 201181697 Y | 1/2009 |

* cited by examiner

*Primary Examiner* — Zachary M Pape
(74) *Attorney, Agent, or Firm* — Altis Law Group, Inc.

(57) ABSTRACT

A heat sink includes a cooling member to dissipate heat, and a fixing member for mounting fasteners. The cooling member includes a base and a number of fins extending from the base. The cooling member and the fixing member are independently formed, and the fixing member is fixed to a bottom of the base of the cooling member via fixing means.

3 Claims, 5 Drawing Sheets

US 8,077,465 B2

HEAT SINK ASSEMBLY WITH FIXING MEMBER

BACKGROUND

1. Technical Field

The present disclosure relates to a heat sink, and a method for manufacturing the heat sink.

2. Description of Related Art

A popular method for manufacturing a heat sink is: firstly, mold a semi-finished product, which includes a base and a number of fins extending from and covering the base; secondly cut away parts of the number of fins to expose a part of the base to form a fixing portion; thirdly, defines four through holes in the fixing portion; and last, install four fasteners in the through holes respectively. Thereby, the heat sink can be fixed to a circuit board via the fasteners for dissipating heat for a component of the circuit board. However, cutting the fins wastes material, which is uneconomical.

DETAILED DESCRIPTION

Figure 1:
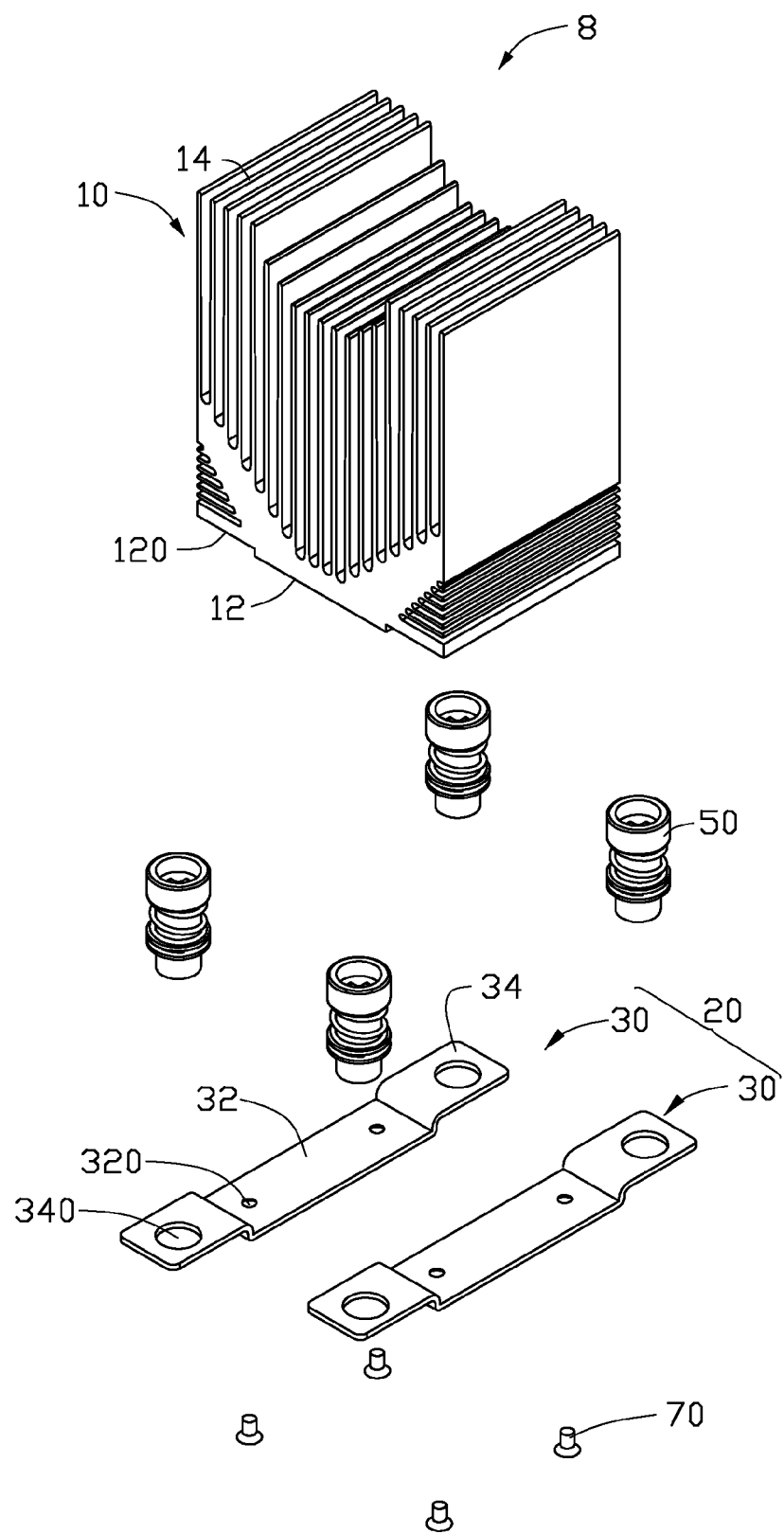
FIG. 1 is an exploded, isometric view of a first embodiment of a heat sink, the heat sink including a fixing member.
Figure 2:
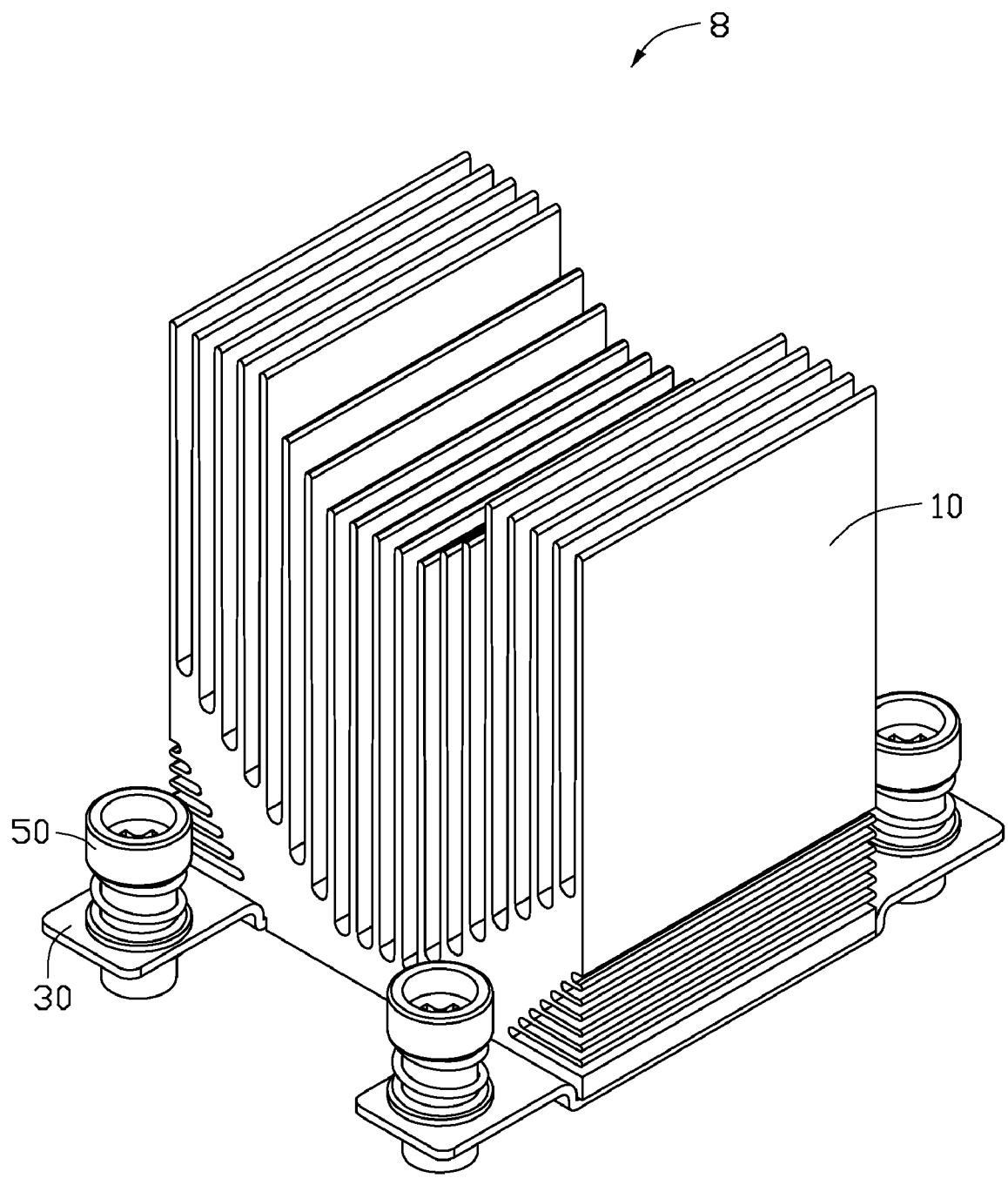
FIG. 2 is an assembled, isometric view of the heat sink of FIG. 1.
Figure 3:
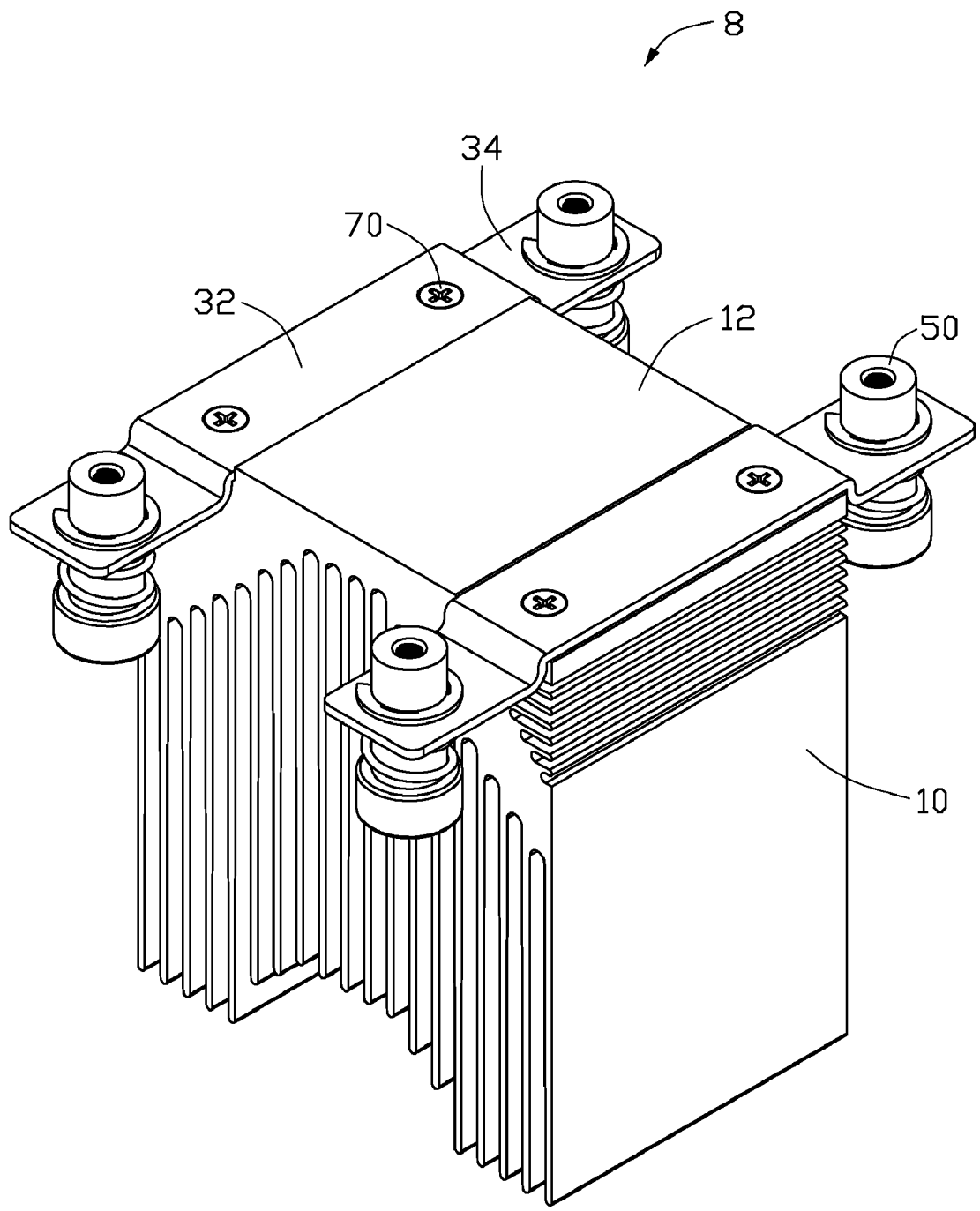
FIG. 3 is a reverse view of the heat sink of FIG. 2.

Referring to FIGS. 1 to 3, an embodiment of a heat sink 8 includes a cooling member 10, a fixing member 20, four fasteners 50, and four screws 70.

The cooling member 10 is used to dissipate heat for a component of an electronic device, such as a central processing unit of a motherboard. The cooling member 10 includes a rectangular flat base 12, and a plurality of fins 14 extending from a top of the base 12. Two grooves 120 are respectively defined in opposite ends of a bottom of the base 12. Two screw holes (not shown) are defined in a bottom of each of the grooves 120.

The fixing member 20 includes two separate metal fixing pieces 30. Each fixing piece 30 includes an elongated mounting portion 32 corresponding to one of the grooves 120 of the base 12, and two fastener mounts 34 respectively extending from opposite ends of the mounting portion 32. Each mounting portion 32 is located at a lower height than the corresponding fastener mounts 34, in order to match the corresponding groove 120 of the base 12. Two through holes 320 are defined in the mounting portions 32 of each fixing piece 30 corresponding to the screw holes of the base 12. A mounting hole 340 is defined in each fastener mount 34.

The fasteners 50 are used to fix the heat sink 8 to the circuit board.

In assembly, the mounting portions 32 of the fixing pieces 30 are received in the corresponding grooves 120 of the cooling member 10. The screws 70 are respectively extended through the through holes 320 of the fixing pieces 30, and engaged in the corresponding screw holes of the base 12 of the cooling member 10, to fix the fixing pieces 30 to the cooling member 10. The fasteners 50 are mounted to the fixing pieces 30 via the mounting holes 340 of the fixing pieces 30.

It is noted that the fasteners 50 may be omitted when the heat sink 8 leaves factory. Retailers may install fasteners to heat sinks before selling.

In other embodiments, the fixing pieces 30 may be fixed to the base 12 of the cooling member 10 via other means instead of the screws 70, such as welding for example.

In other embodiments, the grooves 120 may not be defined, and thereby the fixing member 20 fixed to a flat bottom of the base 12.

Figure 4:
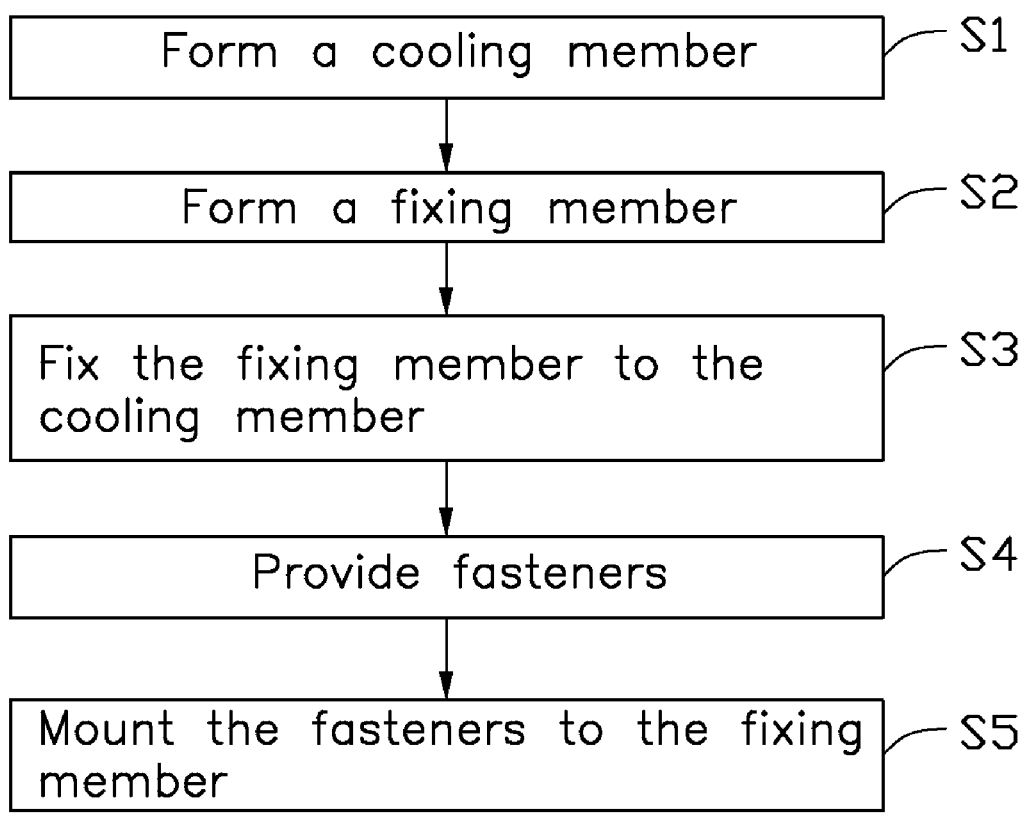
FIG. 4 is a flowchart for manufacturing the heat sink of FIG. 2.

Referring to FIG. 4, a method for manufacturing the heat sink 8 includes the following steps.

Step S1: form the cooling member 10.

Step S2: form the fixing member 20.

Step S3: fix the fixing member 20 to the cooling member 10.

Step S4: provide the fasteners 50.

Step S5: mount the fasteners 50 to the fixing member 20.

It is noted that the order of steps S1 and S2 can be exchanged, the steps S4 and S5 can be omitted, and the steps S4 and S5 can also be performed before the step S3, wherein the step S4 can be performed before the step S1 or S2.

According to the method, when a number of heat sinks 8 are manufactured, the fixing members 20 can be formed in different sizes and/or the spaces between the mounting holes 340 can be different in order to fit different circuit boards that the heat sinks 8 are mounted to, while the cooling members 10 are formed in a same manner. According to the method, less material is wasted. Additionally, the method is easy, and therefore, less costly.

Figure 5:
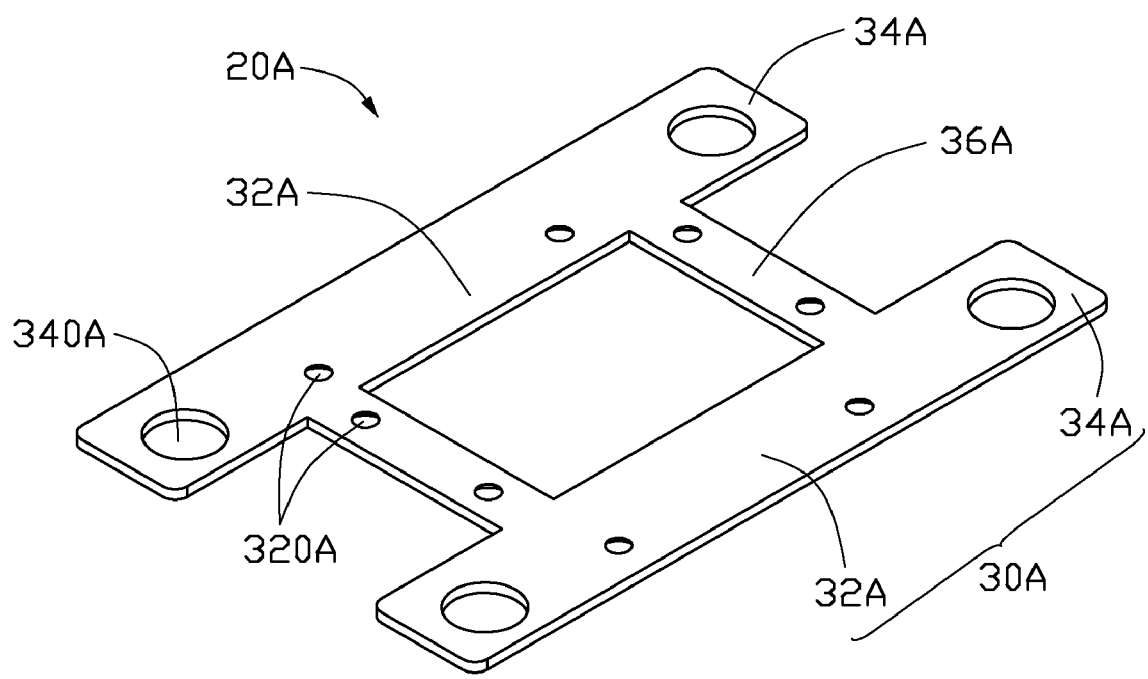
FIG. 5 is an isometric view of another embodiment of a fixing member of the heat sink.

Referring to FIG. 5, in a second embodiment, a fixing member 20A is provided to replace the fixing members 20. The fixing member 20A includes two parallel fixing pieces 30A, and two parallel connecting pieces 36A perpendicularly connected between the fixing pieces 30A. Each fixing piece 30A includes an elongate mounting portion 32A, and two fastener mounts 34A respectively extending from opposite ends of the mounting portion 32A. The mounting portions 32A and the fastener mounts 34A are at a same height. Two through holes 320 are defined in each of the mounting portions 32A and the connecting pieces 36A for eight screws to extend therethrough. A mounting hole 340A is defined in each fastener mount 34A.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat sink assembly, comprising:
a cooling member to dissipate heat, wherein the cooling member comprises a base and a plurality of fins extending from the base; and
a fixing member for mounting fasteners;
wherein the cooling member and the fixing member are independently formed, the fixing member is fixed to a bottom of the base of the cooling member via fixing means, the fixing member comprises two separate fixing pieces, each of the fixing pieces comprises a mounting portion and two fastener mounts respectively extending from opposite ends of the mounting portion, the mounting portion is fixed to the bottom of the base of the cooling member, each of the fastener mounts defines a mounting hole to receive one of the fasteners, two grooves are defined in the bottom of the base of the cooling member, the mounting portions of the fixing pieces are respectively received in the grooves, and the mounting portion of each of the fixing pieces is located at a lower level than the corresponding fastener mounts, in order to match the corresponding groove of the base.

2. The heat sink assembly of claim 1, wherein a plurality of through holes are defined in the mounting portions of the fixing pieces, a plurality of screw holes are defined in the bottom of the base of the cooling member corresponding to the through holes, and wherein the fixing means are a plurality of screws respectively extended through the through holes and engaged in the corresponding screw holes.

3. The heat sink assembly of claim 1, wherein the fixing pieces are made of metal.

* * * * *